(12) United States Patent
Li

(10) Patent No.: US 10,727,263 B2
(45) Date of Patent: Jul. 28, 2020

(54) CAMERA PHOTOSENSITIVE COMPONENT, CAMERA, AND CAMERA SHOOTING TERMINAL

(71) Applicant: BEIJING XIAOMI MOBILE SOFTWARE CO., LTD., Beijing (CN)

(72) Inventor: Guosheng Li, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 121 days.

(21) Appl. No.: 15/984,818

(22) Filed: May 21, 2018

(65) Prior Publication Data
US 2019/0131335 A1 May 2, 2019

(30) Foreign Application Priority Data

Oct. 27, 2017 (CN) .......................... 2017 1 1025227

(51) Int. Cl.
*H01L 27/146* (2006.01)

(52) U.S. Cl.
CPC .. *H01L 27/14627* (2013.01); *H01L 27/14621* (2013.01); *H01L 27/14625* (2013.01); *H01L 27/14645* (2013.01)

(58) Field of Classification Search
CPC ........ H01L 27/14621; H01L 27/14625; H04N 1/488; G02B 27/1086; G02B 27/1013; G02B 27/123
See application file for complete search history.

(56) References Cited

U.S. PATENT DOCUMENTS

| 5,210,400 A | 5/1993 | Usami |
| 6,104,446 A | 8/2000 | Blankenbecler |
| (Continued) | | |

FOREIGN PATENT DOCUMENTS

| CN | 101064771 A | 10/2007 |
| CN | 101154673 A | 4/2008 |
| (Continued) | | |

OTHER PUBLICATIONS

Supplementary European Search Report in the European application No. 18201616.2, dated Mar. 20, 2019, 7 pages.
(Continued)

*Primary Examiner* — Thanh Luu
(74) *Attorney, Agent, or Firm* — Arch & Lake LLP

(57) ABSTRACT

A camera photosensitive component, a camera, and a camera shooting terminal are provided in the field of camera shooting. The camera photosensitive component includes: a silicon substrate layer, a pixel array layer attached to one surface of the silicon substrate layer, and a microprism layer arranged in parallel with the pixel array layer. At least one microprism in the microprism layer is configured to decompose incident light into m color lights for emission. And n color lights in the emitted m color lights are respectively emitted into subpixels in corresponding colors of pixels corresponding to the microprisms, where n is not greater than m. The n color lights may be formed by decomposition with the microprisms, not obtained after part of color light is absorbed by an RGB filter, and transmittance of the color light emitted into the pixels may be improved, thereby reducing an exposure time required by imaging.

20 Claims, 7 Drawing Sheets

(56) References Cited

U.S. PATENT DOCUMENTS

| | | | |
|---|---|---|---|
| 6,590,270 B2 | 7/2003 | Suzuki | |
| 7,176,446 B1* | 2/2007 | Wiedemann | G01J 3/02 |
| | | | 250/208.1 |
| 8,384,818 B2 | 2/2013 | Hiramoto | |
| 2002/0005471 A1* | 1/2002 | Suzuki | H01L 27/14625 |
| | | | 250/208.1 |
| 2008/0117507 A1 | 5/2008 | Olczak | |
| 2010/0051785 A1* | 3/2010 | Dai | H01L 27/14625 |
| | | | 250/208.1 |
| 2010/0188537 A1* | 7/2010 | Hiramoto | H01L 27/14621 |
| | | | 348/294 |
| 2015/0185585 A1 | 7/2015 | Kawai | |
| 2017/0223260 A1 | 8/2017 | Holz | |

FOREIGN PATENT DOCUMENTS

| | | |
|---|---|---|
| CN | 101779288 A | 7/2010 |
| CN | 101986432 A | 3/2011 |
| CN | 102033330 A | 4/2011 |
| CN | 101101432 B | 6/2011 |
| CN | 102510447 A | 6/2012 |
| CN | 105304668 A | 2/2016 |
| CN | 106908993 A | 6/2017 |
| CN | 107613182 A | 1/2018 |
| GB | 2516967 A | 2/2015 |
| JP | H11313334 A | 11/1999 |
| JP | 2001309395 A | 11/2001 |
| JP | 2004172335 A | 6/2004 |
| JP | 2008153518 A | 7/2008 |
| KR | 20110019724 A | 2/2011 |
| WO | 2009153937 A1 | 12/2009 |
| WO | 2018161669 A1 | 9/2018 |

OTHER PUBLICATIONS

Notice of Allowance of the Russian application No. 2018127558, dated Mar. 27, 2019, 18 pages.
First Office Action of the Chinese application No. 201711025227.1, dated Jun. 3, 2019, 21 pages.
Written Opinion of the International Search Authority in the international application No. PCT/CN2018/074525, dated Jul. 18, 2018, 10 pages.
English translation of International Search Report in the international application No. PCT/CN2018/074525, dated Jul. 18, 2018, 2 pages.
International Search Report in International Application No. PCT/CN2018/074525, dated Jul. 18, 2018, 4 pages.
First Office Action issued to the Japanese Application No. 2018-544922, dated Dec. 2, 2019 with English translation, (8p).
Second Office Action issued to Korean Application No. 10-2018-7037980 dated Jun. 2, 2020 with English translation, (11p).

* cited by examiner

CAMERA PHOTOSENSITIVE COMPONENT, CAMERA, AND CAMERA SHOOTING TERMINAL

CROSS-REFERENCE TO RELATED APPLICATION

This application is filed based upon and claims priority to Chinese Patent Application of International Application No. 201711025227.1, filed on Oct. 27, 2017, the entire contents of which are incorporated herein by reference.

TECHNICAL FIELD

The present disclosure generally relates to the technical field of camera shooting, and more particularly, to a camera photosensitive component, a camera, and a camera shooting terminal.

BACKGROUND

Light is emitted onto a photosensitive surface of a pixel in a camera photosensitive component to form an image. Therefore, transmittance of light is a key for imaging.

In a related technology, a camera photosensitive component includes a Red, Green and Blue (RGB) filter, and light is emitted onto a photosensitive surface of a pixel after being filtered through the RGB filter.

SUMMARY

According to a first aspect of aspects of the present disclosure, a camera photosensitive component is provided, which may include: a silicon substrate layer, a pixel array layer attached to one surface of the silicon substrate layer and a microprism layer arranged in parallel with the pixel array layer, wherein microprisms in the microprism layer may be configured to decompose incident light into m color lights for emission, and n color lights in the emitted m color lights may be emitted into subpixels in corresponding colors of pixels corresponding to the microprisms respectively, n≤m.

According to a second aspect of the aspects of the present disclosure, a camera is provided, which may include the camera photosensitive component of the first aspect.

According to a third aspect of the aspects of the present disclosure, a camera shooting terminal is provided, which may include the camera of the second aspect.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate aspects consistent with the present disclosure and, together with the description, serve to explain the principles of the present disclosure.

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of exemplary aspects do not represent all implementations consistent with the present disclosure. Instead, they are merely examples of apparatuses and methods consistent with aspects related to the present disclosure as recited in the appended claims.

Figure 1:
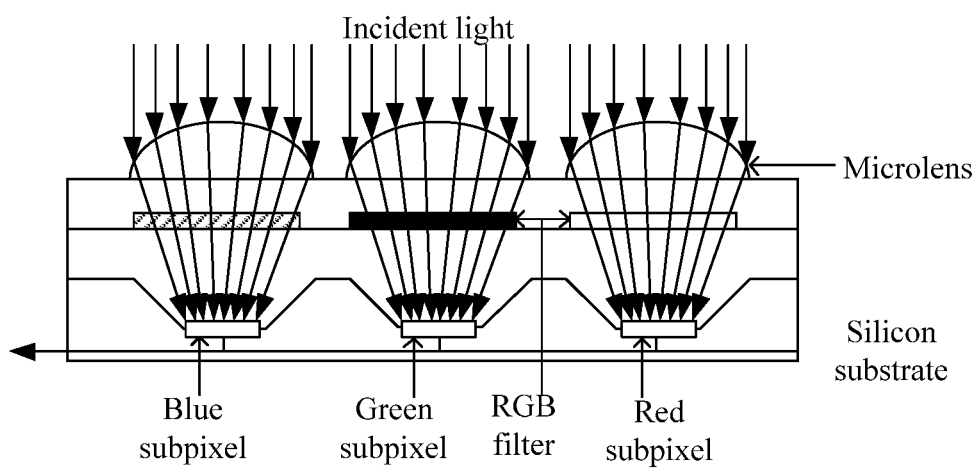
FIG. 1 is a structure diagram of a camera photosensitive component according to the related technology.

FIG. 1 is a structure diagram of a camera photosensitive component according to the related technology. The camera photosensitive component includes a silicon substrate layer, a pixel array layer attached to one surface of the silicon substrate layer, an RGB filter layer arranged in parallel with the pixel array layer and a microlens layer arranged in parallel with the RGB filter layer, and the microlens layer is nonadjacent to the pixel array layer.

For example, a pixel may include three or four or even more subpixels. Descriptions will be made with the condition that a pixel includes three subpixels as an example. Then, the three subpixels are a red subpixel, a green subpixel and a blue subpixel, respectively. Correspondingly, an RGB filter includes three light filters, i.e. a red light filter, a green light filter and a blue light filter respectively. A microlens is arranged above each light filter.

Incident light is perpendicularly emitted into each microlens in the microlens layer, and each microlens refracts the incident light into the corresponding light filter below. The red light filter absorbs light except red light, and emits the red light into the red subpixel; the green light filter absorbs light except green light, and emits the green light into the green subpixel; and the blue light filter absorbs light except blue light, and emits the blue light into the blue subpixel.

Transmittance of the incident light through the RGB filter is very low, averagely about 40%, and the other 60% of light is absorbed, so that an exposure time required by imaging is prolonged. The instant application solves the problem through aspects shown in FIG. 2 to FIG. 6.

Figure 2:
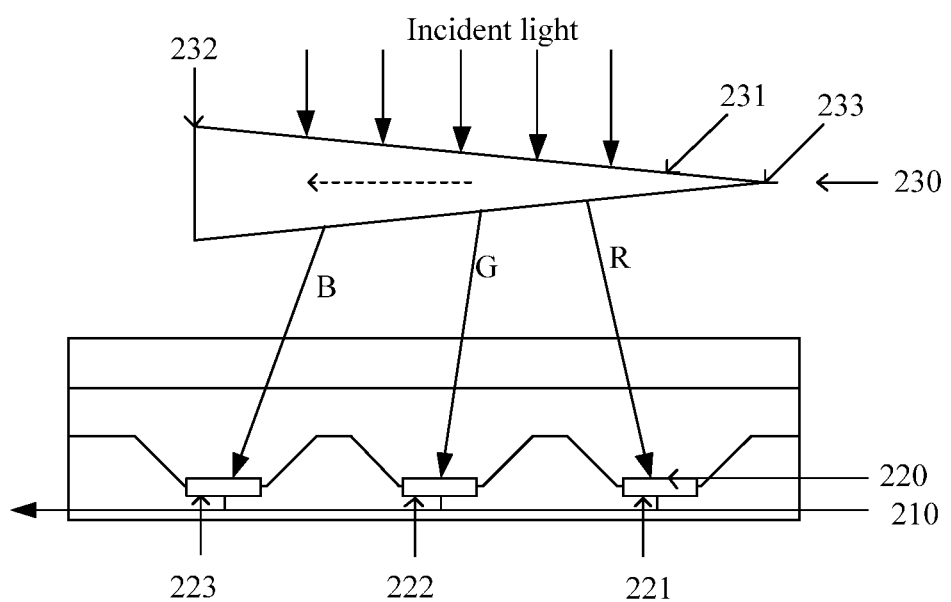
FIG. 2 is a structure diagram of a camera photosensitive component according to an exemplary aspect of the present disclosure.

FIG. 2 is a structure diagram of a camera photosensitive component, according to an exemplary aspect. The camera photosensitive component may be implemented as a camera, and the camera is applied to a camera shooting terminal. As shown in FIG. 2, the camera photosensitive component includes: a silicon substrate layer 210, a pixel array layer 220 attached to one surface of the silicon substrate layer 210, and a microprism layer 230 arranged in parallel with the pixel array layer 220. The silicon substrate layer 210 may include a silicon material such as polysilicon. The pixel array layer 220 may include a plurality of pixels arranged in a predetermined number of columns and rows. The microprism layer 230 may include microprisms, where a microprism may be a precise small prism made of optical glass.

Microprisms 231 in the microprism layer 230 are configured to decompose incident light into m color lights for emission, and n color lights in the emitted m color lights are respectively emitted into subpixels in corresponding colors of pixels corresponding to the microprisms 231. Here, n is not greater than m.

For example, m may be 7, and may also be another numerical value, which will not be limited in the aspect. When m=7, the microprisms 231 may decompose the incident light into seven types of color lights.

In the aspect, a pixel may include three or four or even more subpixels. Descriptions will be made with the condition that a pixel includes three subpixels as an example. Then, each microprism 231 in the microprism layer 230 is configured to decompose the incident light into the seven color lights for emission, emitted red light is emitted into a red subpixel 221 of the pixel corresponding to the microprism 231, emitted green light is emitted into a green subpixel 222 of the pixel, and emitted blue light is emitted into a blue subpixel 223 of the pixel.

From the above, according to the camera photosensitive component provided by the present disclosure, the microprisms decompose the incident light into the m color lights for emission, and the n color lights in the emitted m color lights are respectively emitted into the subpixels in the corresponding colors of the pixels corresponding to the microprisms. In such a manner, the n color lights may be formed by decomposition with the microprisms, not obtained after part of color light is absorbed by an RGB filter, and transmittance of the color light emitted into the pixels may be improved, so that an exposure time required by imaging is reduced, a camera shooting effect under a low-lighting condition may further be improved, and the camera shooting effect on a moving object may also be improved.

Referring to FIG. 2, the camera photosensitive component includes: a silicon substrate layer 210, a pixel array layer 220 attached to one surface of the silicon substrate layer 210, and a microprism layer 230 arranged in parallel with the pixel array layer 220.

The pixel array layer 220 includes a pixel array, and each pixel includes three or four or even more subpixels. When the pixel includes three subpixels, the three subpixels may be a red subpixel, a green subpixel and a blue subpixel, respectively. When the pixel includes four subpixels, the four subpixels are a red subpixel, a green subpixel, a blue subpixel, and a yellow subpixel, respectively. Alternatively, the four subpixels are a red subpixel, a green subpixel, a blue subpixel, and a white subpixel, respectively. A number of subpixels included in each pixel and the subpixels are not limited in the aspect.

Grooves are formed in the surface, attached to the pixel array layer 220, of the silicon substrate layer 210, and each subpixel in each pixel is located in a groove.

Microprisms 231 in the microprism layer 230 are configured to decompose incident light into m color lights for emission, and n color lights in the emitted m color lights are emitted into subpixels in corresponding colors of pixels corresponding to the microprisms 231 respectively, n≤m.

For example, m may be 7, and may also be another numerical value, which will not be limited in the aspect. When m=7, the microprisms 231 may decompose the incident light into seven color lights.

Descriptions will be made with the condition that a pixel includes three subpixels as an example. Then, each microprism 231 in the microprism layer 230 is configured to decompose the incident light into the seven color lights for emission, emitted red light is emitted into a red subpixel 221 of the pixel corresponding to the microprism 231, emitted green light is emitted into a green subpixel 222 of the pixel, and emitted blue light is emitted into a blue subpixel 223 of the pixel.

The microprism layer 230 is configured to decompose the incident light for emission into the pixels. In such a manner, the n color lights may be formed by decomposition with the microprisms 231, not obtained after part of color light is absorbed by an RGB filter, and transmittance of the color light emitted into the pixels may be improved, so that an exposure time required by imaging is reduced, a camera shooting effect under a low-lighting condition may further be improved, and the camera shooting effect on a moving object may also be improved.

In the aspect, there may be multiple position relationships between the microprisms 231 and the pixels. Descriptions will be made in the aspect with three of them as examples.

1) In a first position relationship, each microprism 231 corresponds to a pixel, and the pixel includes n subpixels. In this case, the microprism 231 is configured to decompose the incident light into the m color lights for emission, and the n color lights in the emitted m color lights are emitted into the subpixels in the corresponding colors of the pixel.

Descriptions will be made still with the condition that a pixel includes three subpixels as an example. Then, red light emitted by the microprism 231 is emitted into the red subpixel 221 of the pixel, emitted green light is emitted into the green subpixel 222 of the pixel, and emitted blue light is emitted into the blue subpixel 223 of the pixel.

Referring to FIG. 2, a bottom surface 232 of the microprism 231 is perpendicular to a plane where the pixel array layer 220 is located, and n subpixels arranged in ascending order of refractive indexes (i.e., from small to large refractive indexes) of the corresponding colors are sequentially arranged in the pixel along a direction from a vertex 233 of the microprism 231 to the bottom surface 232.

Descriptions will be made still with the condition that a pixel includes three subpixels as an example. Since a refractive index of the red light is smallest and a refractive index of the blue light is largest, the red subpixel 221, the green subpixel 222 and the blue subpixel 223 are sequentially arranged in the pixel along the direction from the vertex 233 of the microprism 231 to the bottom surface 232.

2) In a second position relationship, every two adjacent microprisms 231 correspond to two adjacent pixels, where each of the first pixel and the second pixel includes n subpixels, and the nth subpixels in the first pixel and the second pixel are adjacent. The first microprism 231 is configured to decompose the incident light into the m color lights for emission, and the n color lights in the emitted m color lights are emitted into the subpixels in the corresponding colors of the first pixel respectively. The second microprism 231 is configured to decompose the incident light into the m color lights for emission, and the n color lights in the emitted m color lights are emitted into the subpixels in the corresponding colors of the second pixel respectively.

Descriptions will be made still with the condition that a pixel includes three subpixels as an example. Then, the red light emitted by the first microprism 231 is emitted into the red subpixel 221 of the first pixel, the emitted green light is emitted into the green subpixel 222 of the first pixel, and the emitted blue light is emitted into the blue subpixel 223 of the first pixel. Similarly, the red light emitted by the second microprism 231 is emitted into the red subpixel 221 of the second pixel, the emitted green light is emitted into the green subpixel 222 of the second pixel, and the emitted blue light is emitted into the blue subpixel 223 of the second pixel.

Figure 3:
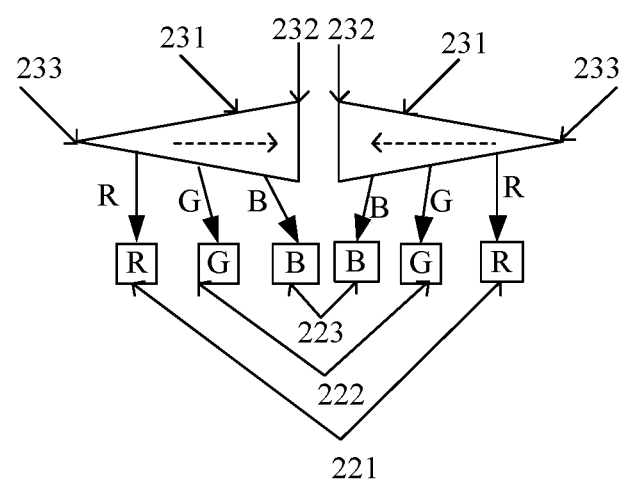
FIG. 3 is a structure diagram of a camera photosensitive component according to an exemplary aspect of the present disclosure.

Referring to FIG. 3, a bottom surface 232 of the first microprism 231 is opposite and parallel to a bottom surface 232 of the second microprism 231, the bottom surface 232 of the first microprism 231 is perpendicular to the plane where the pixel array layer 220 is located, and the bottom surface 232 of the second microprism 231 is perpendicular to the plane where the pixel array layer 220 is located; and n subpixels arranged in ascending order of refractive indexes of the corresponding colors are sequentially arranged in the first pixel along a direction from a vertex 233 of the first microprism 231 to the bottom surface 232, and n subpixels arranged in ascending order of refractive indexes of the corresponding colors are sequentially arranged in the second pixel along a direction from a vertex 233 of the second microprism 231 to the bottom surface 232. In FIG. 3, the direction of the dotted arrow on the left side is the direction from the vertex 233 of the first microprism 231 towards the bottom surface 232, and the direction of the dotted arrow on the right side is the direction from the vertex 233 of the second microprism 231 towards the bottom surface 232.

Descriptions will be made still with the condition that a pixel includes three subpixels as an example. Since the refractive index of the red light is smallest and the refractive index of the blue light is largest, the red subpixel 221, the green subpixel 222, and the blue subpixel 223 are sequentially arranged in the first pixel along the direction from the vertex 233 of the first microprism 231 to the bottom surface 232. Similarly, the red subpixel 221, the green subpixel 222, and the blue subpixel 223 are sequentially arranged in the second pixel along the direction from the vertex 233 of the second microprism 231 to the bottom surface 232. Further, the blue subpixel 223 in the first pixel is adjacent to the blue subpixel 223 in the second pixel.

3) In a third position relationship, every two adjacent microprisms 231 correspond to two adjacent pixels, the first pixel and the second pixel include totally 2n−1 subpixels, and the first pixel and the second pixel share the nth subpixel. The first microprism 231 is configured to decompose the incident light into the m color lights for emission, and the n color lights in the emitted m color lights are emitted into n−1 subpixels in the corresponding colors of the first pixel and the shared nth subpixel respectively. The second microprism 231 is configured to decompose the incident light into the m color lights for emission, and the n color lights in the emitted m color lights are emitted into n−1 subpixels in the corresponding colors of the second pixel and the shared nth subpixel respectively.

Descriptions will be made still with the condition that a pixel includes three subpixels as an example. Then, the red light emitted by the first microprism 231 is emitted into the red subpixel 221 of the first pixel, the emitted green light is emitted into the green subpixel 222 of the first pixel, and the emitted blue light is emitted into the shared blue subpixel 223; and the red light emitted by the second microprism 231 is emitted into the red subpixel 221 of the second pixel, the emitted green light is emitted into the green subpixel 222 of the second pixel, and the emitted blue light is emitted into the shared blue subpixel 223.

The first pixels and the second pixels share the nth subpixels, and since the shared subpixels have relatively large areas, photosensitive areas of the subpixels may be enlarged. Therefore, light transmittance of the subpixels is improved, and the exposure time required by imaging is reduced.

Figure 4:
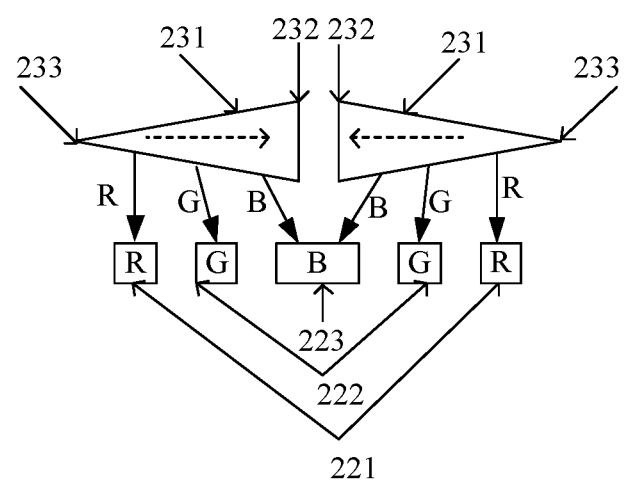
FIG. 4 is a structure diagram of a camera photosensitive component according to an exemplary aspect of the present disclosure.

Referring to FIG. 4, a bottom surface 232 of the first microprism 231 is opposite and parallel to a bottom surface 232 of the second microprism 231, the bottom surface 232 of the first microprism 231 is perpendicular to the plane where the pixel array layer 220 is located, and the bottom surface 232 of the second microprism 231 is perpendicular to the plane where the pixel array layer is located; and n−1 subpixels arranged in ascending order of refractive indexes of the corresponding colors and the shared nth subpixel are sequentially arranged in the first pixel along a direction from a vertex 233 of the first microprism 231 to the bottom surface 232, and n−1 subpixels arranged in ascending order of refractive indexes of the corresponding colors and the shared nth subpixel are sequentially arranged in the second pixel along a direction from a vertex 233 of the second microprism 231 to the bottom surface 232. In FIG. 4, the direction of the dotted arrow on the left side is the direction from the vertex 233 of the first microprism 231 points towards the bottom surface 232, and the direction of the dotted arrow on the right side is the direction from the vertex 233 of the second microprism 231 points towards the bottom surface 232.

Descriptions will be made still with the condition that a pixel includes three subpixels as an example. Since the refractive index of the red light is smallest and the refractive index of the blue light is largest, the red subpixel 221, the green subpixel 222 and the shared blue subpixel 223 are sequentially arranged in the first pixel along the direction from the vertex 233 of the first microprism 231 to the bottom surface 232, and the red subpixel 221, the green subpixel 222 and the shared blue subpixel 223 are sequentially arranged in the second pixel along the direction from the vertex 233 of the second microprism 231 to the bottom surface 232.

In the aspect, a microlens layer 240 may further be arranged between the pixel array layer 220 and the microprism layer 230. The microlens layer 240 is configured to converge the light, and may not influence the transmittance of the light, wherein there may be multiple position relationships between the microlens layer 240 and the microprism layer 230. Descriptions will be made in the aspect with two of them as examples.

1) In a first position relationship, the camera photosensitive component further includes the microlens layer 240. The microlens layer 240 is located between the pixel array layer 220 and the microprism layer 230. The microprisms 231 are configured to decompose the incident light into the m color lights for emission, and microlenses 241 in the microlens layer 240 are configured to independently converge each type of color light of the n color lights in the m color lights emitted by the microprisms 231 for respective emission into the subpixels in the corresponding colors of the pixels corresponding to the microprisms 231.

Figure 5:
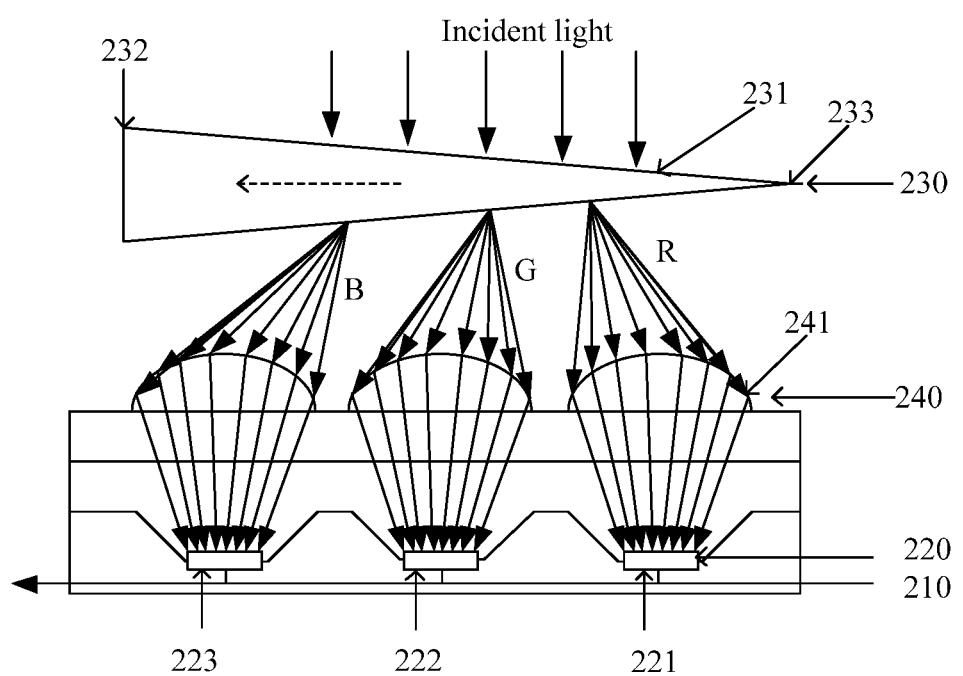
FIG. 5 is a structure diagram of a camera photosensitive component according to an exemplary aspect of the present disclosure.

In an implementation mode shown in FIG. 5, each microlens 241 corresponds to a subpixel. Descriptions will be made still with the condition that a pixel includes three subpixels as an example. Then, the red light emitted by the microprism 231 is converged by the microlens 241 for emission into the red subpixel 221 of the pixel corresponding to the microprism 231, the emitted green light is converged by the microlens 241 for emission into the green subpixel 222 of the pixel, and the emitted blue light is converged by the microlens 241 for emission into the blue subpixel 223 of the pixel.

The microlens layer 240 is located between the pixel array layer 220 and the microprism layer 230, then the microlens layer 240 may independently converge each type of color light in the n color lights emitted by the microprism layer 230 for respective emission into the subpixels in the corresponding colors of the pixels corresponding to the microprisms 231, and complete emission of each color light into the subpixels in the corresponding colors may be ensured, so that the light transmittance of the subpixels is improved, and the exposure time required by imaging is reduced.

2) In a second position relationship, the camera photosensitive component further includes the microlens layer 240, the microlens layer 240 is opposite and parallel to the microprism layer 230, and the microlens layer 240 is non-adjacent to the pixel array layer 220. The microlenses 241 in the microlens layer 240 are configured to converge the incident light for emission; and the microprisms 231 are configured to decompose the converged light emitted by the microlenses 241 into the m color lights for emission, and the n color lights in the emitted m color lights are emitted into the subpixels in the corresponding colors of the pixels corresponding to the microprisms 241.

Figure 6:
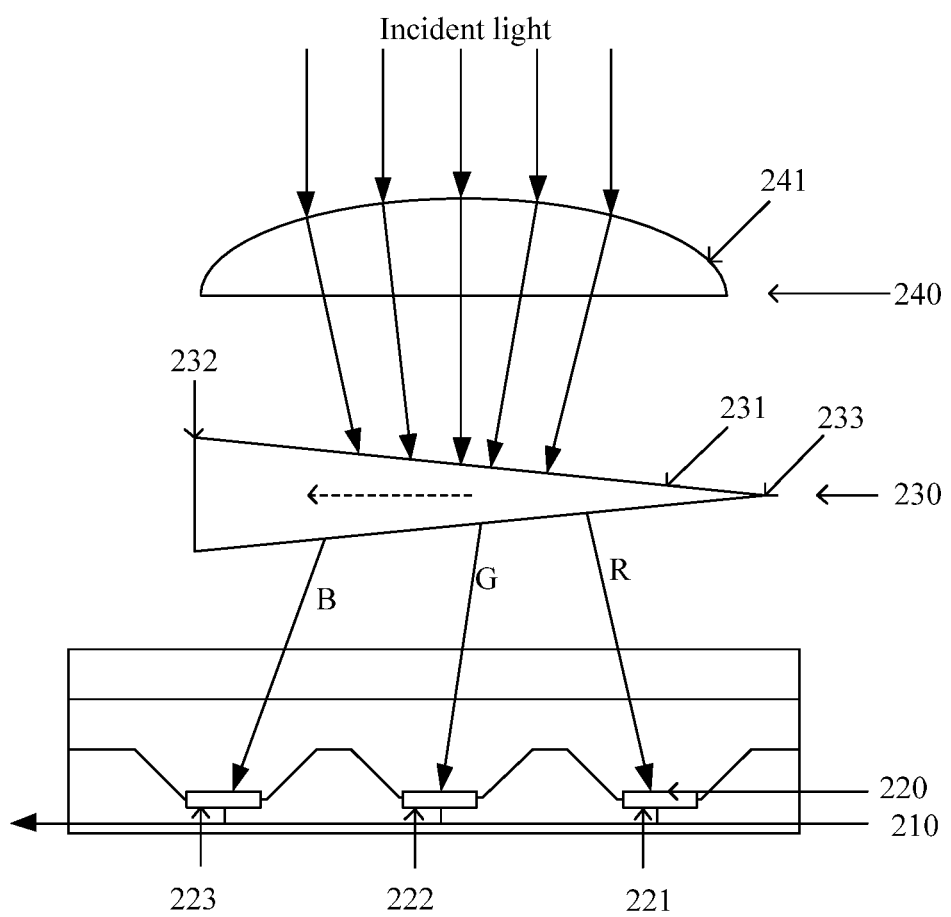
FIG. 6 is a structure diagram of a camera photosensitive component according to an exemplary aspect of the present disclosure.

In an implementation mode, each microlens 241 corresponds to a subpixel, referring to FIG. 6. Descriptions will be made still with the condition that a pixel includes three subpixels as an example. Then, the microprism 231 decomposes the incident light converged by the microlens 241 into seven color lights for emission, the emitted red light is emitted into the red subpixel 221 of the pixel corresponding to the microprism 231, the emitted green light is emitted into the green subpixel 222 of the pixel, and the emitted blue light is emitted into the blue subpixel 223 of the pixel.

There are multiple manners for manufacturing the microprism layer 230. Descriptions will be made in the aspect with two of them as examples.

1) In a first manufacturing manner, the microprism layer 230 is formed by arranging each microprism 231. For example, the microprisms may be arranged in a grid corresponding to pixels the pixel layer. In this case, microprisms 231 with same or approximately same sizes of the pixels may be manufactured and arranged according to the position relationship between each microprism 231 and the pixel, to form the microprism layer 230.

2) In a second manufacturing manner, it is relatively difficult to manufacture microprisms 231 with same or approximately same sizes of the pixels and arrange the microprisms 231, so that the microrprism layer 230 is formed by etching a substrate made from a preset material. In this case, etching may be performed according to the position relationships between the microprisms 231 and the pixels, to form the microprism layer 230. The preset material may be optical glass, quartz glass, an alkali halide crystal, plastics and the like, which will not be limited in the aspect.

From the above, according to the camera photosensitive component provided by the present disclosure, the microprisms decompose the incident light into the m color lights for emission, and the n color lights in the emitted m color lights are emitted into the subpixels in the corresponding colors of the pixels corresponding to the microprisms respectively. In such a manner, the n color lights may be formed by decomposition with the microprisms, not obtained after part of color light is absorbed by an RGB filter, and the transmittance of the color light emitted into the pixels may be improved, so that the exposure time required by imaging is reduced, the camera shooting effect under the low-lighting condition may further be improved, and the camera shooting effect on the moving object may also be improved.

In one example, the first pixels and the second pixels share the nth subpixels. Accordingly, the shared subpixels have relatively large areas and the photosensitive areas of the subpixels may be enlarged. Therefore, the light transmittance of the subpixels is improved, and the exposure time required by imaging is reduced.

The microlens layer is located between the pixel array layer and the microprism layer, then the microlens layer may independently converge each type of color light of the n color lights emitted by the microprism layer for respective emission into the subpixels in the corresponding colors of the pixels corresponding to the microprisms, and complete emission of each color light into the subpixels in the corresponding colors may be ensured, so that the light transmittance of the subpixels is improved, and the exposure time required by imaging is reduced.

The microprism layer is formed by etching the substrate made from the preset material, so that it is unnecessary to manufacture and arrange microprisms with same or approximately same sizes of the pixels, and difficulties in implementation of the microprism layer may be reduced.

Figure 7:
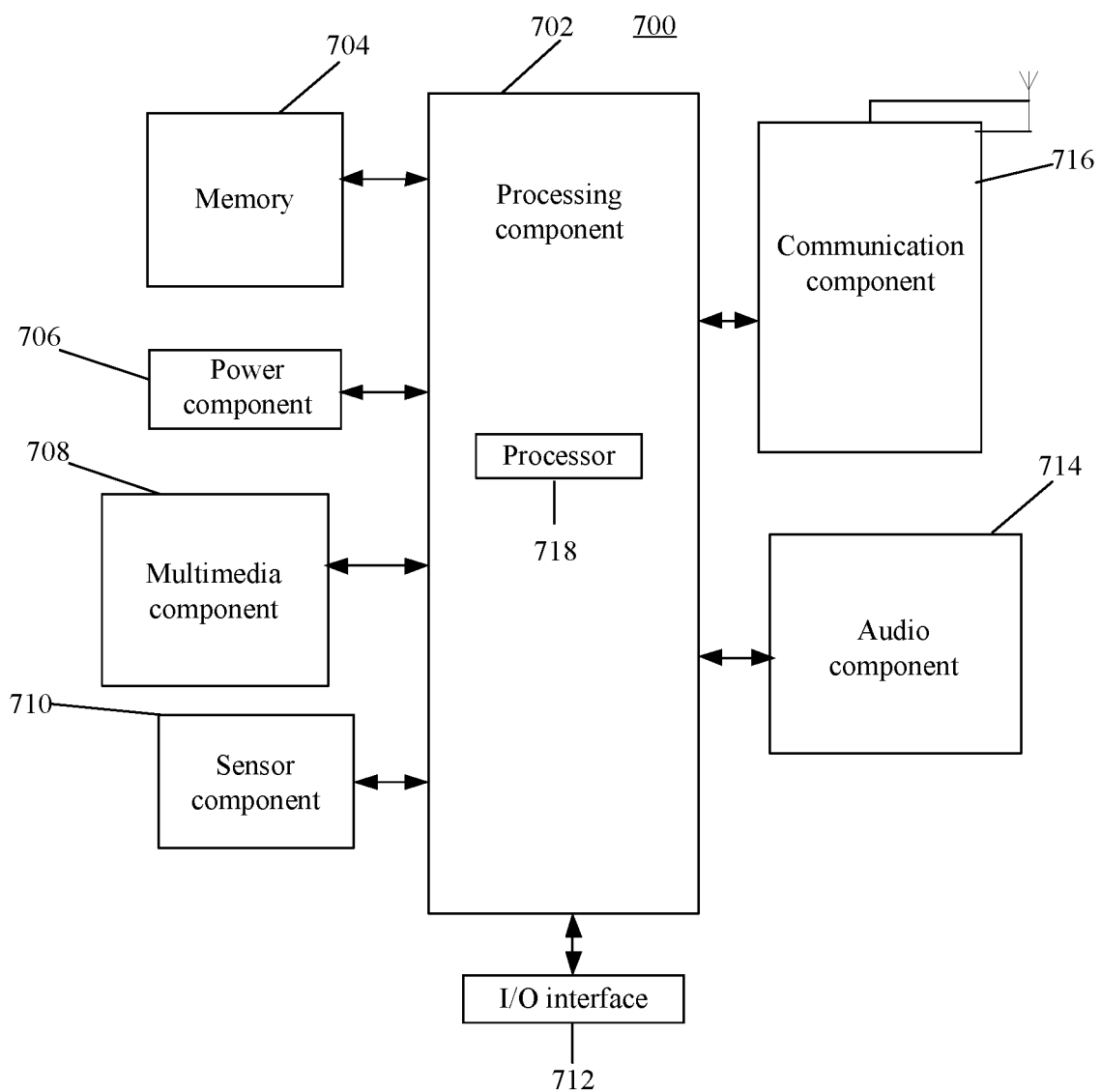
FIG. 7 is a block diagram of a device carrying a camera photosensitive component according to an exemplary aspect of the present disclosure.

FIG. 7 is a block diagram of a device 700 carrying a camera photosensitive component, according to an exemplary aspect. For example, the device 700 may be a mobile phone, a computer, a digital broadcast terminal, a messaging device, a gaming console, a tablet, a medical device, exercise equipment, a personal digital assistant, and the like.

Referring to FIG. 7, the device 700 may include one or more of the following components: a processing component 702, a memory 704, a power component 706, a multimedia component 708, an audio component 710, an Input/Output (I/O) interface 712, a sensor component 714, and a communication component 716.

The processing component 702 typically controls overall operations of the device 700, such as the operations associated with display, telephone calls, data communications, camera operations, and recording operations. The processing component 702 may include one or more processors 718 to execute instructions to perform all or part of the steps in the abovementioned method. Moreover, the processing component 702 may include one or more modules which facilitate interaction between the processing component 702 and the other components. For instance, the processing component 702 may include a multimedia module to facilitate interaction between the multimedia component 708 and the processing component 702.

The memory 704 is configured to store various types of data to support the operation of the device 700. Examples of such data include instructions for any application programs or methods operated on the device 700, contact data, phonebook data, messages, pictures, video, etc. The memory 704 may be implemented by any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, and a magnetic or optical disk.

The power component 706 provides power for various components of the device 700. The power component 706 may include a power management system, one or more power supplies, and other components associated with the generation, management and distribution of power for the device 700.

The multimedia component 708 includes a screen providing an output interface between the device 700 and a user. In some aspects, the screen may include a Liquid Crystal Display (LCD) and a Touch Panel (TP). If the screen includes the TP, the screen may be implemented as a touch screen to receive an input signal from the user. The TP includes one or more touch sensors to sense touches, swipes and gestures on the TP. The touch sensors may not only sense a boundary of a touch or swipe action, but also detect a duration and pressure associated with the touch or swipe action. In some aspects, the multimedia component 708 includes a front camera and/or a rear camera. The front camera and/or the rear camera may receive external multimedia data when the device 700 is in an operation mode, such as a photographing mode or a video mode. Each of the front camera and the rear camera may be a fixed optical lens system or have focusing and optical zooming capabilities.

The audio component 710 is configured to output and/or input an audio signal. For example, the audio component 710 includes a Microphone (MIC), and the MIC is configured to receive an external audio signal when the device 700 is in the operation mode, such as a call mode, a recording mode and a voice recognition mode. The received audio signal may be further stored in the memory 704 or sent through the communication component 716. In some aspects, the audio component 710 further includes a speaker configured to output the audio signal.

The I/O interface 712 provides an interface between the processing component 702 and a peripheral interface module, and the peripheral interface module may be a keyboard, a click wheel, a button and the like. The button may include, but not limited to: a home button, a volume button, a starting button and a locking button.

The sensor component 714 includes one or more sensors configured to provide status assessment in various aspects for the device 700. For instance, the sensor component 714 may detect an on/off status of the device 700 and relative positioning of components, such as a display and small keyboard of the device 700, and the sensor component 714 may further detect a change in a position of the device 700 or a component of the device 700, presence or absence of contact between the user and the device 700, orientation or acceleration/deceleration of the device 700 and a change in temperature of the device 700. The sensor component 714 may include a proximity sensor configured to detect presence of an object nearby without any physical contact. The sensor component 714 may also include a light sensor, such as a Complementary Metal Oxide Semiconductor (CMOS) or Charge Coupled Device (CCD) image sensor, configured for use in an imaging application. The sensor component 714 may include camera photosensitive component disclosed above. In some aspects, the sensor component 714 may also include an acceleration sensor, a gyroscope sensor, a magnetic sensor, a pressure sensor or a temperature sensor.

The communication component 716 is configured to facilitate wired or wireless communication between the device 700 and other equipment. The device 700 may access a communication-standard-based wireless network, such as a Wireless Fidelity (WiFi) network, a 2nd-Generation (2G) or 3rd-Generation (3G) network or a combination thereof. In an exemplary aspect, the communication component 716 receives a broadcast signal or broadcast associated information from an external broadcast management system through a broadcast channel. In an exemplary aspect, the communication component 716 further facilitates a Near Field Communication (NFC) module to facilitate short-range communication. For example, the NFC module may be implemented on the basis of a Radio Frequency Identification (RFID) technology, an Infrared Data Association (IrDA) technology, an Ultra-WideBand (UWB) technology, a Bluetooth (BT) technology and another technology.

In an exemplary aspect, the device 700 may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned method.

In an exemplary aspect, there is also provided a non-transitory computer-readable storage medium including an instruction, such as the memory 704 including an instruction, and the instruction may be executed by the processor 718 of the device 700 to implement the abovementioned method. For example, the non-transitory computer-readable storage medium may be a ROM, a Random Access Memory (RAM), a Compact Disc Read-Only Memory (CD-ROM), a magnetic tape, a floppy disc, optical data storage equipment and the like.

The technical solutions provided by the aspects of the present disclosure may achieve the following beneficial effects.

The microprisms decompose the incident light into the m color lights for emission, and the n color lights in the emitted m color lights are emitted into the subpixels in the corresponding colors of the pixels corresponding to the microprisms, respectively. In such a manner, the n color lights may be formed by decomposition with the microprisms, not obtained after part of color light is absorbed by an RGB filter, and transmittance of the color light emitted into the pixels may be improved, so that an exposure time required for imaging is reduced, a camera shooting effect under a low-lighting condition may further be improved, and the camera shooting effect on a moving object may also be improved.

The first pixels and the second pixels share the nth subpixels, and since the shared subpixels have relatively large areas, photosensitive areas of the subpixels may be enlarged. Therefore, light transmittance of the subpixels is improved, and the exposure time required for imaging is reduced.

The microlens layer is located between the pixel array layer and the microprism layer, then the microlens layer may independently converge each type of color light of the n color lights emitted by the microprism layer for respective emission into the subpixels in the corresponding colors of the pixels corresponding to the microprisms, and complete emission of each type of color light into the subpixels in the corresponding colors may be ensured, so that the light transmittance of the subpixels is improved, and the exposure time required for imaging is reduced.

The microprism layer is formed by etching the substrate made from the preset material, so that it is unnecessary to manufacture and arrange microprisms with same or approximately same sizes of the pixels, and difficulties in implementation of the microprism layer may be reduced.

Other aspects of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A camera photosensitive component, comprising:
a silicon substrate layer;
a pixel array layer attached to one surface of the silicon substrate layer; and
a microprism layer arranged in parallel with the pixel array layer, the microprism layer comprising microprisms,
wherein the microprisms in the microprism layer are configured to decompose incident light into m color lights for emission, n color lights in the emitted m color lights are respectively emitted into subpixels in corresponding colors of pixels corresponding to the microprisms, and n is not greater than m; and
every two adjacent microprisms correspond to two adjacent pixels: a first pixel and a second pixel, the first pixel and the second pixel comprise 2n−1 subpixels, the first pixel and the second pixel share a nth subpixel, and the nth subpixel shared by the first pixel and the second pixel has a larger area than other subpixels.

2. The camera photosensitive component of claim 1, wherein a first microprism is configured to decompose the incident light into the m color lights for emission, the n color lights in the emitted m color lights are respectively emitted into n−1 subpixels in the corresponding colors of the first pixel and the shared nth subpixel, a second microprism is configured to decompose the incident light into the m color lights for emission, and the n color lights in the emitted m color lights are respectively emitted into n−1 subpixels in the corresponding colors of the second pixel and the shared nth subpixel.

3. The camera photosensitive component of claim 2, wherein a bottom surface of the first microprism is opposite and parallel to a bottom surface of the second microprism, the bottom surface of the first microprism is perpendicular to the plane where the pixel array layer is located, and the bottom surface of the second microprism is perpendicular to the plane where the pixel array layer is located; and
the n−1 subpixels arranged in ascending order of refractive indexes of the corresponding colors and the shared nth subpixel are sequentially arranged in the first pixel along a direction from a vertex of the first microprism to the bottom surface of the first microprism, and the n−1 subpixels arranged in ascending order of refractive indexes of the corresponding colors and the shared nth subpixel are sequentially arranged in the second pixel along a direction from a vertex of the second microprism to the bottom surface of the second microprism.

4. The camera photosensitive component of claim 1, further comprising a microlens layer located between the pixel array layer and the microprism layer;
wherein the microprisms are configured to decompose the incident light into the m color lights for emission; and
wherein microlenses in the microlens layer are configured to independently converge each type of color light of the n color lights in the m color lights emitted by the microprisms for respective emission into the subpixels in the corresponding colors of the pixels corresponding to the microprisms.

5. The camera photosensitive component of claim 1, further comprising a microlens layer, wherein the microlens layer is parallel to the microprism layer, and the microlens layer is nonadjacent to the pixel array layer;
wherein microlenses in the microlens layer are configured to converge the incident light for emission; and
wherein the microprisms are configured to decompose the converged light emitted by the microlenses into the m color lights for emission, and the n color lights in the emitted m color lights are emitted into the subpixels in the corresponding colors of the pixels corresponding to the microprisms.

6. The camera photosensitive component of claim 1, wherein the microprism layer comprises an array of microprisms arranged in a grid corresponding to the pixel layer.

7. The camera photosensitive component of claim 1, wherein the microprism layer is formed by etching a substrate made from a preset material according to preset position relationships between the microprisms and the pixels in the pixel layer.

8. A camera, comprising a camera photosensitive component, wherein
the camera photosensitive component comprises: a silicon substrate layer, a pixel array layer attached to one surface of the silicon substrate layer, and a microprism layer arranged in parallel with the pixel array layer, the microprism layer comprising microprisms,
wherein microprisms in the microprism layer are configured to decompose incident light into m color lights for emission, n color lights in the emitted m color lights are respectively emitted into subpixels in corresponding colors of pixels corresponding to the microprisms, and n is not greater than m; and
every two adjacent microprisms correspond to two adjacent pixels: a first pixel and a second pixel, the first pixel and the second pixel comprise 2n−1 subpixels, the first pixel and the second pixel share a nth subpixel, and the nth subpixel shared by the first pixel and the second pixel has a larger area than other subpixels.

9. The camera of claim 8, wherein a first microprism is configured to decompose the incident light into the m color lights for emission, the n color lights in the emitted m color lights are respectively emitted into n−1 subpixels in the corresponding colors of the first pixel and the shared nth subpixel, a second microprism is configured to decompose the incident light into the m color lights for emission, and the n color lights in the emitted m color lights are respectively emitted into n−1 subpixels in the corresponding colors of the second pixel and the shared nth subpixel.

10. The camera of claim 9, wherein a bottom surface of the first microprism is opposite and parallel to a bottom surface of the second microprism, the bottom surface of the first microprism is perpendicular to the plane where the pixel array layer is located, and the bottom surface of the second microprism is perpendicular to the plane where the pixel array layer is located; and
the n−1 subpixels arranged in ascending order of refractive indexes of the corresponding colors and the shared nth subpixel are sequentially arranged in the first pixel along a direction from a vertex of the first microprism to the bottom surface of the first microprism, and the n−1 subpixels arranged in ascending order of refractive indexes of the corresponding colors and the shared nth subpixel are sequentially arranged in the second pixel along a direction from a vertex of the second microprism to the bottom surface of the second microprism.

11. The camera of claim 8, wherein the camera photosensitive component further comprises a microlens layer located between the pixel array layer and the microprism layer;
    wherein the microprisms are configured to decompose the incident light into the m color lights for emission; and
    wherein microlenses in the microlens layer are configured to independently converge each type of color light of the n color lights in the m color lights emitted by the microprisms for respective emission into the subpixels in the corresponding colors of the pixels corresponding to the microprisms.

12. The camera of claim 8, wherein the camera photosensitive component further comprises a microlens layer, wherein the microlens layer is parallel to the microprism layer, and the microlens layer is nonadjacent to the pixel array layer;
    wherein microlenses in the microlens layer are configured to converge the incident light for emission; and
    wherein the microprisms are configured to decompose the converged light emitted by the microlenses into the m color lights for emission, and the n color lights in the emitted m color lights are emitted into the subpixels in the corresponding colors of the pixels corresponding to the microprisms.

13. The camera of claim 8, wherein the microprism layer comprises an array of microprisms arranged in a grid corresponding to the pixel layer.

14. The camera of claim 8, wherein the microprism layer is formed by etching a substrate made from a preset material according to preset position relationships between the microprisms and the pixels in the pixel layer.

15. A camera shooting terminal, comprising a camera, the camera comprising a camera photosensitive component, wherein
    the camera photosensitive component comprises: a silicon substrate layer, a pixel array layer attached to one surface of the silicon substrate layer and a microprism layer arranged in parallel with the pixel array layer, the microprism layer comprising microprisms,
    wherein microprisms in the microprism layer are configured to decompose incident light into m color lights for emission, n color lights in the emitted m color lights are respectively emitted into subpixels in corresponding colors of pixels corresponding to the microprisms, and n is not greater than m; and
    every two adjacent microprisms correspond to two adjacent pixels: a first pixel and a second pixel, the first pixel and the second pixel comprise 2n−1 subpixels, the first pixel and the second pixel share a nth subpixel, and the nth subpixel shared by the first pixel and the second pixel has a larger area than other subpixels.

16. The camera shooting terminal of claim 15, wherein the photosensitive component further comprises a microlens layer located between the pixel array layer and the microprism layer;
    wherein the microprisms are configured to decompose the incident light into the m color lights for emission; and
    wherein microlenses in the microlens layer are configured to independently converge each type of color light of the n color lights in the m color lights emitted by the microprisms for respective emission into the subpixels in the corresponding colors of the pixels corresponding to the microprisms.

17. The camera shooting terminal of claim 15, wherein a first microprism is configured to decompose the incident light into the m color lights for emission, the n color lights in the emitted m color lights are respectively emitted into n−1 subpixels in the corresponding colors of the first pixel and the shared nth subpixel, a second microprism is configured to decompose the incident light into the m color lights for emission, and the n color lights in the emitted m color lights are respectively emitted into n−1 subpixels in the corresponding colors of the second pixel and the shared nth subpixel.

18. The camera shooting terminal of claim 17, wherein a bottom surface of the first microprism is opposite and parallel to a bottom surface of the second microprism, the bottom surface of the first microprism is perpendicular to the plane where the pixel array layer is located, and the bottom surface of the second microprism is perpendicular to the plane where the pixel array layer is located; and
    the n−1 subpixels arranged in ascending order of refractive indexes of the corresponding colors and the shared nth subpixel are sequentially arranged in the first pixel along a direction from a vertex of the first microprism to the bottom surface of the first microprism, and the n−1 subpixels arranged in ascending order of refractive indexes of the corresponding colors and the shared nth subpixel are sequentially arranged in the second pixel along a direction from a vertex of the second microprism to the bottom surface of the second microprism.

19. The camera shooting terminal of claim 15, wherein the camera photosensitive component further comprises a microlens layer, wherein the microlens layer is parallel to the microprism layer, and the microlens layer is nonadjacent to the pixel array layer;
    wherein microlenses in the microlens layer are configured to converge the incident light for emission; and
    wherein the microprisms are configured to decompose the converged light emitted by the microlenses into the m color lights for emission, and the n color lights in the emitted m color lights are emitted into the subpixels in the corresponding colors of the pixels corresponding to the microprisms.

20. The camera shooting terminal of claim 15, wherein the microprism layer comprises an array of microprisms arranged in a grid corresponding to the pixel layer.

* * * * *